United States Patent
Wang et al.

(10) Patent No.: US 7,545,841 B2
(45) Date of Patent: Jun. 9, 2009

(54) COMPOSITE MATERIAL WITH PROXIMAL GAIN MEDIUM

(75) Inventors: Shih-Yuan Wang, Palo Alto, CA (US); Alexandre Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 168 days.

(21) Appl. No.: 11/789,283

(22) Filed: Apr. 24, 2007

(65) Prior Publication Data
US 2008/0267243 A1 Oct. 30, 2008

(51) Int. Cl.
*H01S 5/00* (2006.01)
*H01Q 19/06* (2006.01)
(52) U.S. Cl. ............... 372/50.22; 372/50.1; 343/754
(58) Field of Classification Search ........... 372/50.1, 372/50.22, 69, 92; 343/754
See application file for complete search history.

(56) References Cited

U.S. PATENT DOCUMENTS

| | | | |
|---|---|---|---|
| 5,436,759 A | 7/1995 | Dijaili et al. | |
| 6,445,495 B1 | 9/2002 | Walker et al. | |
| 6,538,808 B1 | 3/2003 | Tastavridis | |
| 6,560,010 B1 | 5/2003 | Dijaili et al. | |
| 6,714,344 B2 | 3/2004 | Islam et al. | |
| 6,747,794 B2 | 6/2004 | Wang | |
| 6,847,054 B1 | 1/2005 | Dijaili et al. | |
| 6,865,020 B2 | 3/2005 | Kim et al. | |
| 6,906,856 B1 | 6/2005 | Dijaili et al. | |
| 7,113,329 B2 | 9/2006 | Dijaili et al. | |

FOREIGN PATENT DOCUMENTS

WO   WO 2006/023195 A2   3/2006

OTHER PUBLICATIONS

Dolling, et al., "Negative Index Material at 780 nm Wavelength," Optics Letters, vol. 32, No. 1, pp. 53-55 (Jan. 1, 2007).
Zhang, et al., "Experimental Demonstration of Near-Infrared Negative-Index Metamaterials," Phys. Rev. Lett 95, 137404-1 - 137404-5 (Sep. 23, 2005).
Pendry, et al., "Reversing Light with Negative Refraction," Physics Today, 57 [6] 37-43 (Jun. 2004).

*Primary Examiner*—Armando Rodriguez

(57) ABSTRACT

An apparatus and related methods are described, the apparatus comprising a composite material layer configured to exhibit at least one of a negative effective permittivity and a negative effective permeability for radiation of at least one wavelength propagating therethrough. The apparatus further comprises a layer of gain material proximal to the composite material layer, the layer of gain material providing amplification for the propagating radiation. The layer of gain material is disposed within a laser cavity and pumped to a lasing condition for the laser cavity, the layer of gain material thereby providing gain-clamped amplification for the propagating radiation.

20 Claims, 3 Drawing Sheets

COMPOSITE MATERIAL WITH PROXIMAL GAIN MEDIUM

STATEMENT REGARDING FEDERALLY SPONSORED RESEARCH OR DEVELOPMENT

This invention was made with Government support under Agreement No. HR0011-05-3-0002, awarded by DARPA. The Government has certain rights in the invention.

FIELD

This patent specification relates generally to the propagation of electromagnetic radiation and, more particularly, to composite materials capable of exhibiting at least one of negative effective permeability and negative effective permittivity with respect to incident electromagnetic radiation.

BACKGROUND

Substantial attention has been directed in recent years toward composite materials capable of exhibiting negative effective permeability and/or negative effective permittivity with respect to incident electromagnetic radiation. Such materials, often termed metamaterials, usually comprise periodic arrays of electromagnetically reactive cells that are of substantially small dimension (e.g., 20% or less) compared to the wavelength of the incident radiation. A metamaterial can comprise a dielectric patterned with one or more conductors (for example, a dielectric substrate patterned with metallic split-ring resonators), or alternatively can comprise conductors patterned with one or more dielectrics (for example, a so-called "fishnet" structure in which a conductive sheet is patterned with air holes). Although the individual response of any particular electromagnetically reactive cell to an incident wavefront can be quite complicated, the aggregate response across the population of electromagnetically reactive cells can be described macroscopically, as if the composite material were a continuous material, except that the permeability term is replaced by an effective permeability and the permittivity term is replaced by an effective permittivity. Depending on the size, structure, and arrangement of the electromagnetically reactive cells, as well as the frequency at which incident radiation is applied, certain metamaterials can sometimes simultaneously exhibit both a negative effective permeability and a negative effective permittivity, such metamaterials being termed negative index materials.

Potential industrial applicabilities for metamaterials and negative index materials include so-called superlenses having the ability to image far below the diffraction limit to $\lambda/6$ and beyond, new designs for airborne radar, high resolution nuclear magnetic resonance (NMR) systems for medical imaging, microwave lenses, and other radiation processing devices. Issues arise in the realization of useful devices from such composite materials. By way of example, incident radiation can experience substantial power loss while propagating through many known metamaterials and negative index materials. Other issues arise as would be apparent to one skilled in the art in view of the present disclosure.

SUMMARY

In accordance with an embodiment, an apparatus is provided comprising a composite material layer configured to exhibit at least one of a negative effective permittivity and a negative effective permeability for radiation of at least one wavelength propagating therethrough. The apparatus further comprises a layer of gain material proximal to the composite material layer, the layer of gain material providing amplification for the propagating radiation. The layer of gain material is disposed within a laser cavity and pumped to a lasing condition for the laser cavity. The layer of gain material thereby provides gain-clamped amplification for the propagating radiation.

Also provided is a method, comprising receiving at a composite material layer electromagnetic radiation at an operating frequency for propagation therethrough. The composite material layer is configured to exhibit at least one of a negative effective permittivity and a negative effective permeability for electromagnetic radiation at the operating frequency. The method further comprises providing pump power to a layer of gain material disposed proximal to the composite material layer. The layer of gain material is disposed within a laser cavity, and the pump power is sufficient to cause a lasing condition for the laser cavity such that the layer of gain material provides gain-clamped amplification for the propagating electromagnetic radiation.

Also provided is an apparatus comprising a composite material layer configured to exhibit at least one of a negative effective permittivity and a negative effective permeability for radiation of at least one wavelength propagating therethrough, and a ballast laser substantially adjacent to the composite material layer. The ballast laser includes a layer of gain material generally parallel to the composite material layer and disposed within a near field distance thereof. The layer of gain material provides amplification for the radiation propagating through the composite material layer. The apparatus further comprises means for pumping the layer of gain material to a lasing condition for the ballast laser, and when the ballast laser is so lasing, the amplification of the radiation propagating through the composite material layer is gain-clamped.

DETAILED DESCRIPTION

Figure 1:
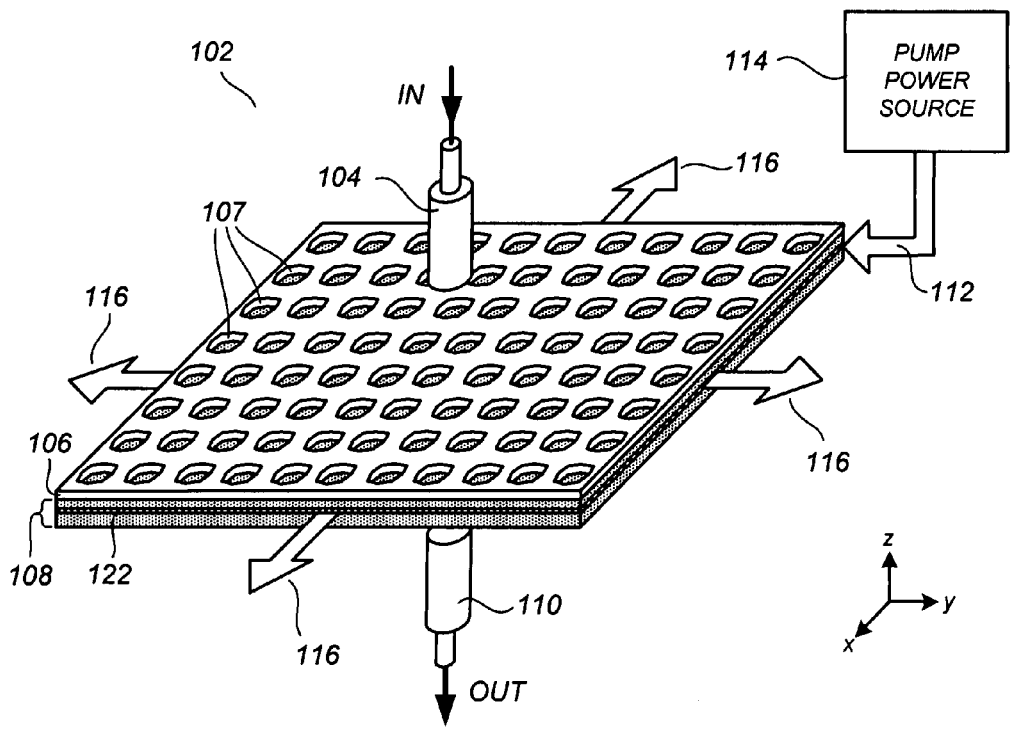
FIG. 1 illustrates a perspective view of a composite material and a proximal gain medium according to an embodiment.

FIG. 1 illustrates an apparatus 102 according to an embodiment, comprising a composite material layer 106 and a proximal ballast laser cavity 108, the ballast laser cavity 108 including a gain material layer 122. The composite material layer 106 receives an input optical signal IN from a radiation source device 104 which, while illustrated as a small point-like source in FIG. 1, can include any of a variety of source types including point sources and spatially distributed sources of coherent or incoherent radiation without departing from the scope of the present teachings. Alternatively, the incident radiation can simply arrive as a free-space traveling wave without a nearby source device.

It is to be appreciated that although particular examples are presented herein in the context of optical signals in the visible and near-infrared regimes, the scope of the present teachings is not so limited and can include a wide range of radiation frequencies including, but not limited to, microwave, infrared, visible, and/or ultraviolet frequencies. The propagated radiation is received at a radiation receiving device 110 from which emanates an output optical signal OUT. Although illustrated as a small point-like receiving device in the embodiment of FIG. 1, the radiation receiving device 110 can include any of a variety of radiation receiver types including point receivers and spatially distributed receivers of coherent or incoherent radiation. Alternatively, without departing from the scope of the present teachings, the propagated radiation can simply be output from the composite material layer 106 and ballast laser cavity 108 toward the adjacent space without being received at a particular point-like receiving device.

The composite material layer 106 is configured and dimensioned to exhibit negative effective permittivity and/or negative effective permeability at a frequency of the propagating radiation. Suitable metamaterial structures having such characteristics, which continue to be discovered and developed in the art, can include (a) dielectric materials patterned with one or more conductors, as well as (b) conductors patterned with one or more dielectrics. An example of (a) can include a nonconducting semiconductor substrate layer substantially transparent at the frequency of the propagating radiation and supporting a periodic array of split-ring resonator structures formed in silver or gold, the split-ring resonators being about $\lambda/10$-$\lambda/20$ in linear dimension and having inter-center spacings between about $\lambda/5$-$\lambda/10$. In another example of (a), the conductors can comprise populations of silver or gold parallel nanobar pairs, each pair having a height of $\lambda/5$ and bar separation of $\lambda/20$. Metamaterial properties can be exhibited for a variety of different positioning schemes for the parallel nanobar pairs, including scenarios where the parallel nanobar pairs all face one direction, scenarios where different subgroups of the parallel nanobar pairs face different directions, and even scenarios where the locations and orientations of the parallel nanobar pairs are random. An example of (b) is illustrated in the example of FIG. 1, in which the composite material layer 106 comprises a metallic fishnet structure in which an electrically conductive sheet or film (e.g., silver) is patterned with a dielectric (e.g., air) in the form of air holes 107.

For an operating wavelength of 780 nm, one suitable set of dimensions for the fishnet structure of the composite material layer 106 is for the air holes 107 to be roughly 200 nm wide and to have center-to-center spacings of about 300 nm. The generally square air holes 107 can slightly depart from a perfect square by having opposing sides that are 198 nm apart at their centers and 182 nm apart near the corners. For embodiments in which the gain material layer 122 of the ballast laser cavity 108 is electrically pumped, one advantage of using a conductive film patterned with discrete dielectric islands is that the entire material surface can be used as an electrode for supplying electrical pump current to the gain material layer 122, the electrical pump current flowing from the conductive film through the gain material layer 122 to another electrode lying therebelow (not shown in FIG. 1). In other embodiments in which the gain material layer 122 is optically pumped, the fishnet structure can also be used provided that there is sufficient access of the optical pump radiation to the gain material layer 122.

According to an embodiment, the gain material layer 122 is selected and configured to have an amplification band that includes the frequency of the propagating radiation (i.e., the radiation propagating generally in the negative-z direction in FIG. 1 between IN and OUT). When the gain material layer 122 is pumped by a pump power source 114, which provides electrical pump power in some embodiments and optical pump power in other embodiments, the gain material layer 122 acts as an optical amplifier for that propagating radiation.

Also according to an embodiment, the gain material layer 122 and the ballast laser cavity 108 therearound are configured and dimensioned to achieve a lasing condition when sufficiently pumped by the pump power source 114, lasing being achieved in a direction transverse to (or, more generally, nonparallel to) the direction of propagation of the propagating radiation. When this lasing is achieved, ballast laser radiation 116 is usually emitted in that transverse (or nonparallel) direction.

When the ballast laser cavity 108 is lasing, the gain material layer 122 provides gain-clamped amplification of the vertically propagating radiation across a wide variety of input power ranges. Recalling that radiation amplification as provided by the gain material layer 122 relies on the phenomenon of stimulated emission, gain clamped amplification refers to the maintenance of a constant gain, or the avoidance of gain saturation effects, over a range of input powers by maintaining the robust population inversion associated with a lasing condition. This can be contrasted with a gain saturation scenario in which a peak in the input signal can result in a depletion of excited states sufficient to cause the gain to sag for a period of time until the excited states are sufficiently restored. A variety of undesirable outcomes can result from gain saturation effects including, for example, crosstalk between channels if the propagating radiation is carrying wavelength division multiplexed information signals.

It is generally not required that the ballast laser radiation 116 be put to any particular use, although in some embodiments it may be used as an indicator signal, either to a human observer or an automated detector, that the device is operating satisfactorily. Because the ballast laser radiation 116 is not itself the primary achievement goal of the device embodiment of FIG. 1, but rather is more of a by-product in the achievement of gain-clamped amplification for the vertically propagating radiation, the ballast laser cavity 108 can be somewhat relaxed in its design specification, at least when contrasted with lasers for which the main goal is to achieve the output laser light. Thus, for example, while the ballast laser cavity 108 should have reflective end facets positioned at two or more opposing ends, and/or Bragg gratings grown at the two or more opposing ends to achieve enough reflectivity for a lasing condition to occur, it is not required that these elements be as high of a quality as would be required, for example, in a laser cavity that needs high modal precision in its output. The direction of emission of the ballast laser radiation 116 likewise does not need to be of particularly high precision as long as it is substantially non-parallel to the direction of propagation of the radiation of interest (e.g., substantially non-parallel to the vertical direction in the example FIG. 1). The overall vertical dimension (thickness) of the ballast laser cavity 108 can likewise be compromised somewhat in favor of spacing criteria relevant to the vertically propagating radiation, provided only that the conditions for ballast lasing are not destroyed outright. Stated another way, the ballast laser cavity 108 can be rather inefficient in its operation, provided that it can achieve lasing when sufficiently pumped so that the gain material layer 122 can provide gain-clamped amplification for the vertically propagating radiation of FIG. 1.

The wavelength of the ballast laser radiation 116 can be the same as, or different than, the wavelength of the vertically propagating radiation, although both should lie within a common amplification band of the gain material layer 122. For one embodiment, the amplification band of the gain material layer 122 is in the optical C-band which is relevant in dense wavelength multiplexed division optical communications, with the propagating radiation and the ballast laser radiation 116 each being in the range of 1525 nm-1565 nm.

For one embodiment designed to accommodate near-field imaging, collimation, or other near field processing effects for the vertically propagating radiation, the ballast laser cavity 108 has a thickness that is less than one wavelength of the propagating radiation (as index-normalized for the materials thereof), with the gain material layer 122 thus being contained within that one wavelength distance of the composite material layer 106. For one embodiment, the gain material layer 122 is within one-tenth of the wavelength of the propagating radiation from the composite material layer 106.

Figure 2:
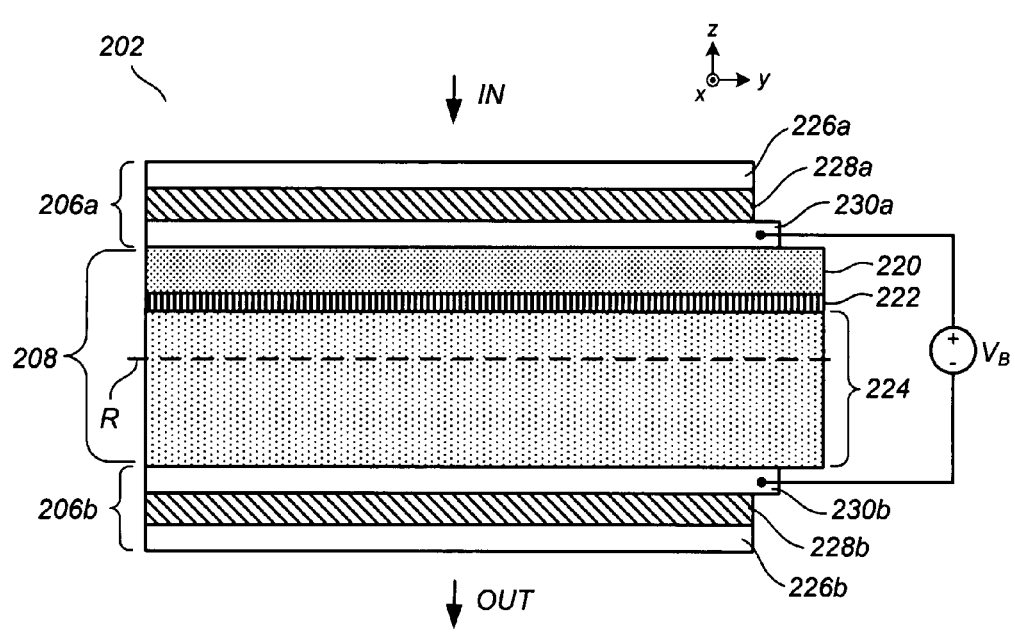
FIGS. 2-4 illustrate side views of composite materials and proximal gain media according to one or more embodiments.

FIG. 2 illustrates a side cut-away view of an apparatus 202 according to an embodiment, comprising two composite material layers 206a and 206b lying on opposite sides of a ballast laser cavity 208, the ballast laser cavity 208 including a gain material layer 222 that is electrically pumped by an electrical pump source $V_B$. The composite material layer 206a is of a tri-layer fishnet type, comprising an electrically conductive film layer 226a such as 25-nm thick silver, a 35-nm thick silicon dioxide layer 228a, and another electrically conductive film layer 230a such as 25-nm thick silver, and having a horizontal (x-y plane) pattern of air holes (not shown) similar to the air holes 107 of FIG. 1 extending through all three layers 226a, 228a, and 230a. Composite material layer 206b contains layers 226b, 228b, and 230b similar to layers 226a, 228a, and 230a, respectively, having a similar pattern of air holes therethrough.

Advantageously, the film layers 230a and 230b serve a dual purpose by acting as electrodes for facilitating a uniform electrical pump current through the gain material layer 222 while also providing metamaterial functionality with respect to the vertically propagating radiation. Ballast laser cavity 208 comprises a first semiconductor layer 220 disposed between the film layer 230a and the gain material layer 222, the first semiconductor layer 220 comprising p-doped InP, for example. Ballast laser cavity 208 further comprises a second semiconductor layer 224 disposed between the gain material layer 222 and the film layer 230b, the second semiconductor layer 224 comprising n-doped InP, for example. For an exemplary operating wavelength in the 1525 nm-1565 nm optical C-band, gain material layer 222 can comprise multiple quantum wells according to a InGaAsP/InGaAs/InP material system. The thicknesses of the semiconductor layers 220 and 224, as well as gain material layer 222, are selected such that there is spacing between the film layers 230a and 230b suitable to achieve the desired near-field propagation/imaging/collimation effects thereof (or other desired metamaterial optical propagation effects), while also being suitable to accommodate transverse lasing in the ballast laser cavity 208, with the understanding that the transverse ballast lasing can be somewhat imperfect in terms of modal precision. When the ballast laser cavity 208 is lasing, ballast laser light (not shown) is emitted generally parallel to the x-y plane in FIG. 2. By way of example and not by way of limitation, one set of thicknesses for the 1525 nm-1565 nm optical C-band can be in the range of 10 nm to 100 nm for the first semiconductor layer 220, 3 nm to 5 nm for the gain material layer 222, and 100 nm-300 nm for the second semiconductor layer 224.

Also shown in FIG. 2 is a plane R located approximately halfway between the film layers 230a and 230b. For one embodiment in which it is desired to have a point-type radiation source (not shown; see example of FIG. 1) on the input side that is imaged onto a point-type radiation receiver (not shown; also see example of FIG. 1) in accordance with a "flat-lensing" application, the use of the two composite material layers 206a and 206b also serves as a way to accommodate the necessarily finite thickness of the ballast laser 208 while still achieving the desired near-field flat-lensing goals. More specifically, where the point-type radiation source is located a first near-field distance from the composite material layer 206a, the thickness of the ballast laser cavity 208 can be selected such that the plane R is equal to that first distance (as index-normalized) and therefore a first real image of the point-type radiation source is formed at the plane R. Moreover, for such embodiment, the radiation receiving device can be placed that same first distance from the composite material layer 206b on the output side, in which case the first real image at the plane R propagates forward to form a second real image at the radiation receiving device in accordance with the desired goal.

Figure 3:
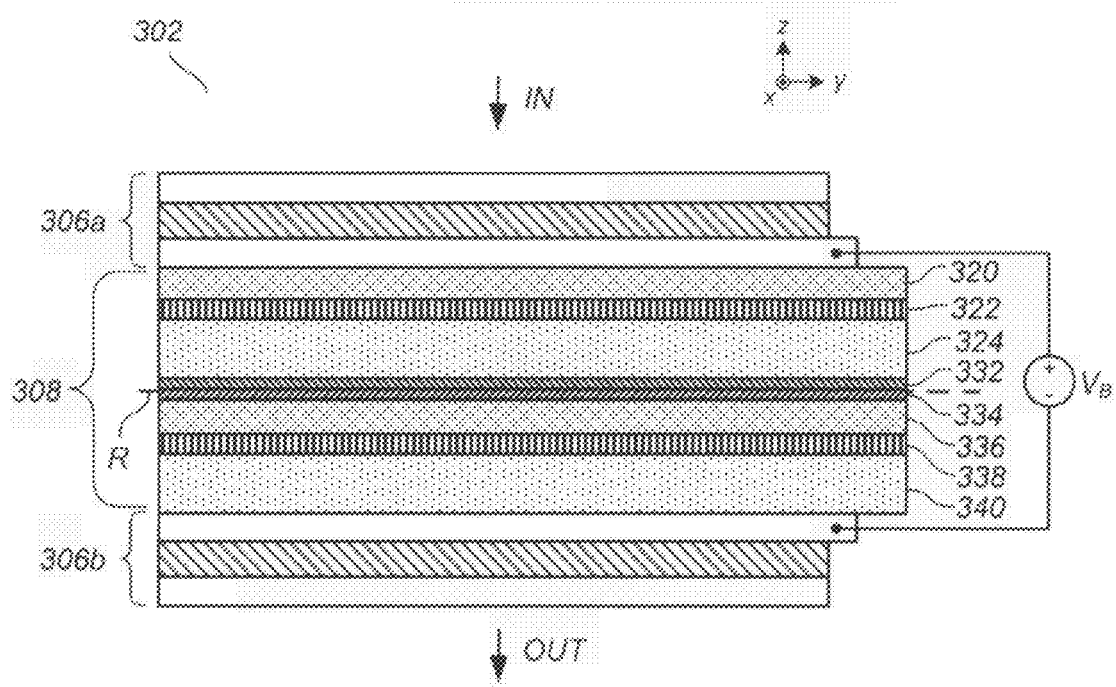

FIG. 3 illustrates a side cut-away view of an apparatus 302 according to an embodiment which is similar to that of FIG. 2, except that two gain material layers 322 and 338 are provided between the two composite material layers. Apparatus 302 comprises composite material layers 306a and 306b that are similar to the composite material layers 206a and 206b of FIG. 2, supra, with a ballast laser cavity 308 therebetween in which the gain material layers 322 and 338 are provided. Formed in an InP-based material system, the ballast laser cavity 308 comprises a top to bottom sequence of a p-doped layer 320, the gain material layer 322, an n-doped layer 324, an n+ layer 332, a p+ layer 334, an n-doped layer 336, the gain material layer 338, and an n-doped layer 340. A real image can propagate forward to appear at plane R on its way toward an output radiation receiver (not shown) in a manner similar to that described supra with respect to FIG. 2. The n+ layer 332, p+ layer 334, and n-doped layer 336 form a tunnel junction configuration that allows the discrete gain material layers 322 and 338 to be electrically pumped with a common pump source $V_B$.

Figure 4:
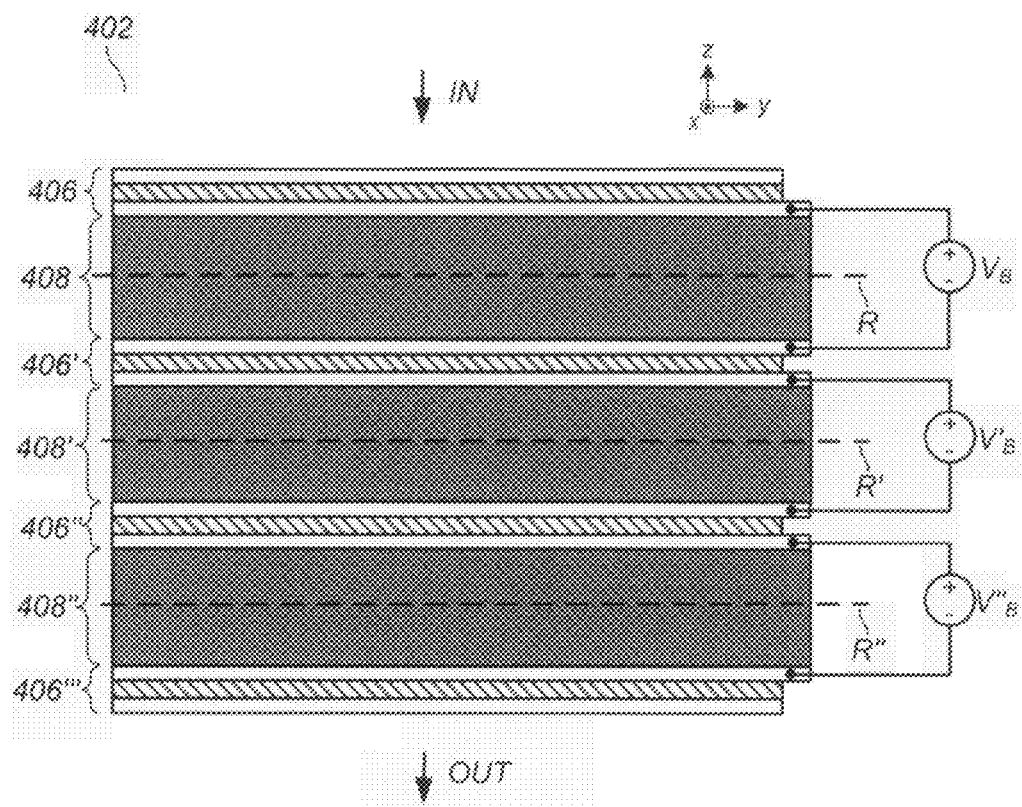

FIG. 4 illustrates side cut-away view of an apparatus 402 according to an embodiment, comprising four composite material layers (406, 406', 406", and 406'") in an optical series configuration, and further comprising three ballast laser cavities (408, 408', and 408") in the intervening spaces. Each ballast laser cavity comprises its own gain material layer (not shown) and is electrically pumped using its own respective electrical pump source ($V_B$, $V'_B$, and $V''_B$, respectively). Real images can propagate forward to appear at planes R, R' and R" on their way toward an output radiation receiver in a manner similar to that described supra with respect to FIG. 2. The four composite material layers (406, 406', 406", and 406'") are each similar in structure to the composite material layers 206a and 206b of FIG. 2. The use of such tri-layer composite material layers, in which an upper conductive film is separated from a lower conductive film by a non-conducting middle layer, provides the ability to have electrically separate pump sources while having an optical series configuration with respect to the propagating radiation.

Figure 5:
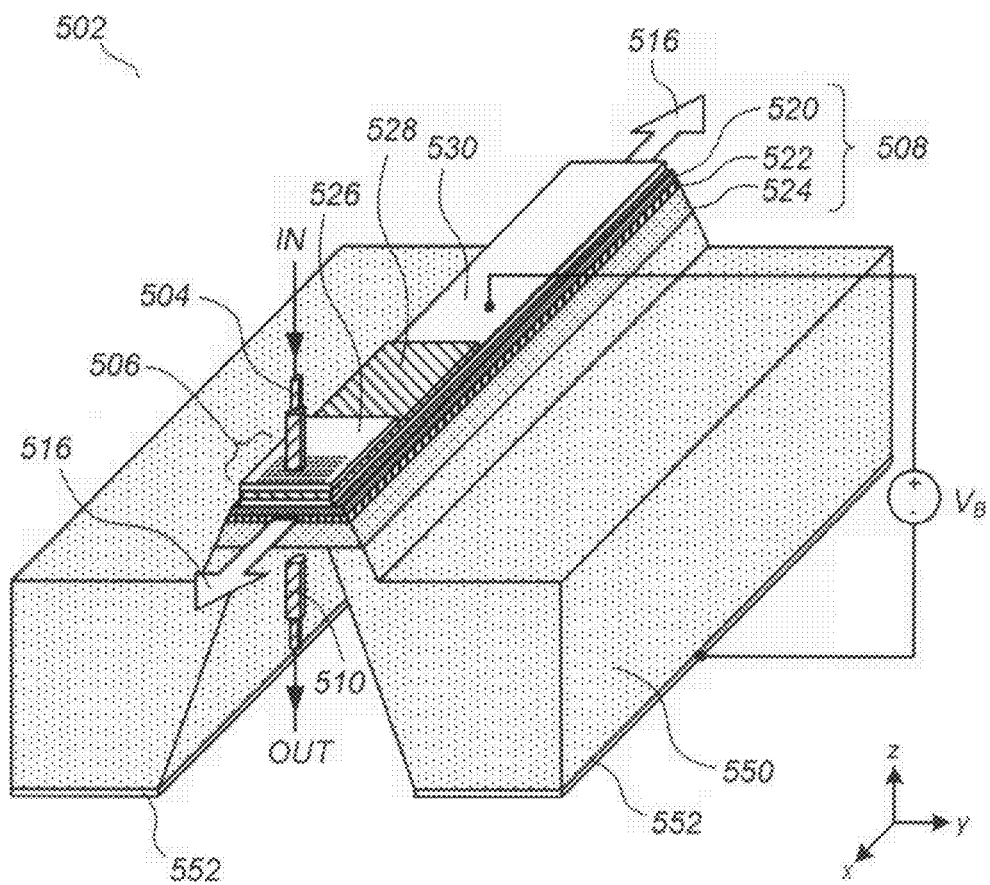
FIG. 5 illustrates a perspective view of an apparatus according to one or more embodiments.

FIG. 5 illustrates a perspective cut-away view of an apparatus 502 that is functionally similar to the apparatus 102 of FIG. 1, supra, and further includes surrounding material structures, including pump current electrodes, that were omitted from the illustration of FIG. 1 for clarity. Apparatus 502 comprises a composite material layer 506 that is formed by a lateral portion of layers 526, 528, and 530 that have air through-holes and that are similar in structure to layers 226a, 228a, and 230a, respectively, of FIG. 2, supra. The composite material layer 506 is disposed atop a ballast laser cavity 508 that is formed on a ridge structure along a substrate 550, comprising a p-doped layer 520, a multi-quantum well gain material layer 522, and an n-doped layer 524. Formed on the bottom of the substrate 550 are pump current electrodes 552, the electrical current flowing from pump source $V_B$, through the gain material layer 522, toward the pump current electrodes 552, and back again to the pump source $V_B$. The raised ridge along which the ballast laser 508 is formed provides for horizontal confinement of the ballast laser radiation 516, which is thus emitted along only a single direction (the positive and negative x-direction), in distinction to the multi-directional emission of the embodiment of FIG. 1. A radiation source device 504 emits radiation that propagates through the composite material layer 506 and that is amplified in a gain-clamped fashion by the gain material layer 522 on its way to a radiation receiving device 510. The substrate 550 is back-etched to accommodate near-field placement of the radiation receiving device 510 relative to the composite material layer 506 and gain material layer 522. It is to be appreciated that the example of FIG. 5 represents one of several different ways for physical implementation of an apparatus according to one or more of the embodiments, and that such physical implementations would be apparent and achievable by a person skilled in the art without undue experimentation in view of the present disclosure.

Particular materials and dimensions for optical control devices and radiation control devices having the above-described structures and functionalities can be identified for the relevant operating wavelength by a person skilled in the art using known design techniques in view of the present disclosure. Fabrication of devices according to one or more of the embodiments can be achieved using known integrated circuit fabrication methods including, but not limited to: deposition methods such as chemical vapor deposition (CVD), metal-organic CVD (MOCVD), plasma enhanced CVD (PECVD), chemical solution deposition (CSD), sol-gel based CSD, metal-organic decomposition (MOD), Langmuir-Blodgett (LB) techniques, thermal evaporation/molecular beam epitaxy (MBE), sputtering (DC, magnetron, RF), and pulsed laser deposition (PLD); lithographic methods such as optical lithography, extreme ultraviolet (EUV) lithography, x-ray lithography, electron beam lithography, focused ion beam (FIB) lithography, and nanoimprint lithography; removal methods such as wet etching (isotropic, anisotropic), dry etching, reactive ion etching (RIE), ion beam etching (IBE), reactive IBE (RIBE), chemical-assisted IBE (CAIBE), and chemical-mechanical polishing (CMP); modifying methods such as radiative treatment, thermal annealing, ion beam treatment, and mechanical modification; and assembly methods such as stacking, wafer bonding, surface mount, and other wiring and bonding methods.

Whereas many alterations and modifications of the embodiments will no doubt become apparent to a person of ordinary skill in the art after having read the foregoing description, it is to be understood that the particular embodiments shown and described by way of illustration are in no way intended to be considered limiting. By way of example, various operating points and/or dimensions of the composite material layer(s), ballast lasers, or other nearby composite or continuous materials, can be modulated in real-time or near-real time without departing from the scope of the embodiments. Likewise, the pump power signal can be modulated (for example, between an off state and a lasing state or between a sub-lasing state and a lasing state) to achieve modulation of the propagating optical signal without departing from the scope of the present teachings. By way of further example, although the gain material layer is described in one or more embodiments supra as being disposed on the output side of a single metamaterial layer or being disposed between two metamaterial layers, in other embodiments the gain material layer can be disposed on the source side of one or more metamaterial layers. Whether placed before or after the metamaterial layer(s), it is preferable that the gain material layer(s) be located within a near field distance of their nearest metamaterial layer. Thus, reference to the details of the described embodiments are not intended to limit their scope.

What is claimed is:

1. An apparatus, comprising:
    a composite material layer configured to exhibit at least one of a negative effective permittivity and a negative effective permeability for radiation of at least one wavelength propagating therethrough; and
    a layer of gain material proximal to said composite material layer, the layer of gain material providing amplification for said propagating radiation, wherein said layer of gain material is disposed within a laser cavity and pumped to a lasing condition for said laser cavity, whereby said layer of gain material provides gain-clamped amplification for said propagating radiation.

2. The apparatus of claim 1, said laser cavity emitting laser radiation in a direction generally transverse to a direction of propagation of said propagating radiation.

3. The apparatus of claim 2, wherein said layer of gain material is disposed within a first distance of said composite material layer, and wherein said first distance is less than one-tenth of said wavelength of said propagating radiation.

4. The apparatus of claim 1, wherein said layer of gain material is disposed within a near field distance of said composite material layer.

5. The apparatus of claim 1, wherein said layer of gain material is pumped to said lasing condition by one of an optical pump source and an electrical pump source.

6. The apparatus of claim 1, wherein said composite material layer comprises an electrically conductive film patterned with a dielectric material, and wherein said layer of gain material is electrically pumped to said lasing condition by an electrical current flowing from said electrically conductive film through said layer of gain material.

7. The apparatus of claim 6, said composite material layer being a first composite material layer and said electrically conductive film being a first electrically conductive film, wherein said laser cavity comprises:
    a first semiconductor layer disposed between said electrically conductive film and said layer of gain material and comprising a first semiconductor material doped with an impurity of a first type; and
    a second semiconductor layer disposed on a side of said layer of gain material opposite said first semiconductor layer and comprising the first semiconductor material doped with an impurity of a second type;
    wherein said apparatus further comprises a second composite material layer configured to exhibit at least one of a negative effective permittivity and a negative effective permeability for said propagating radiation, said second composite material comprising a second electrically conductive film patterned with a dielectric material disposed on a side of said second semiconductor layer opposite said layer of gain material;
    and wherein said electrical current flows between said first and second electrically conductive films through said layer of gain material.

8. The apparatus of claim 1, said composite material layer being a first composite material layer, said layer of gain material being a first layer of gain material, and said laser cavity being a first laser cavity, the apparatus receiving incident radiation on an input side that propagates therethrough toward an output side, the apparatus further comprising:
    a second composite material layer disposed on an output side of said first layer of gain material, said second composite material layer being configured to exhibit at least one of a negative effective permittivity and a negative effective permeability for said propagating radiation; and a second laser cavity including a second layer of gain material disposed on an output side of second composite material layer, said second layer of gain material being pumped to a lasing condition for said second laser cavity, said second layer of gain material also providing gain-clamped amplification for said propagating radiation.

9. The apparatus of claim 1, said composite material layer being a first composite material layer, the apparatus receiving incident radiation on an input side that propagates therethrough toward an output side, the apparatus further comprising:

a second composite material layer similar to said first composite material layer and being disposed on an output side of said first layer of gain material;

a radiation source device positioned on the input side of said first composite material layer and separated therefrom by a source distance, wherein said first and second composite material layers are separated by an index-normalized separation distance that is approximately twice said source distance; and a radiation receiving device disposed on the output side of said second composite material layer and separated therefrom by a receiver distance that is approximately equal to said source distance.

10. The apparatus of claim 1, wherein said at least one wavelength is approximately in the range of 1530-1565 nm, and wherein said gain material comprises multiple quantum wells according to an InGaAsP/InGaAs/InP material system.

11. A method, comprising:

receiving at a composite material layer electromagnetic radiation at an operating frequency for propagation therethrough, the composite material layer being configured to exhibit at least one of a negative effective permittivity and a negative effective permeability for electromagnetic radiation at said operating frequency; and providing pump power to a layer of gain material disposed proximal to said composite material layer, the layer of gain material being disposed within a laser cavity;

wherein said pump power is sufficient to cause a lasing condition for said laser cavity such that said layer of gain material provides gain-clamped amplification for said propagating electromagnetic radiation.

12. The method of claim 11, wherein said laser cavity is generally slab shaped and oriented substantially parallel to said composite material layer, wherein said laser cavity emits laser radiation along a plane substantially parallel to said composite material layer, and wherein said laser cavity has a thickness substantially less than one wavelength of said electromagnetic radiation at said operating frequency.

13. The method of claim 11, wherein said providing pump power to said layer of gain material comprises one of providing optical pump power and providing electrical pump power.

14. The method of claim 11, wherein said composite material layer comprises an electrically conductive film patterned with a dielectric material, and wherein said providing pump power comprises providing an electrical current that passes from the electrically conductive film through said layer of gain material.

15. The method of claim 11, said composite material layer being a first composite material layer, the received electromagnetic radiation being incident on an input side of the first composite material layer and propagating through to an output side thereof, wherein the electromagnetic radiation further propagates through a second composite material layer similar to said first composite material layer and disposed on the output side thereof.

16. The method of claim 11, the received electromagnetic radiation being incident on an input side of the composite material layer and propagating through to an output side thereof, wherein said layer of gain material is disposed on one of said input side and said output side of said composite material layer.

17. An apparatus, comprising:

a composite material layer configured to exhibit at least one of a negative effective permittivity and a negative effective permeability for radiation of at least one wavelength propagating therethrough;

a ballast laser substantially adjacent to said composite material layer, said ballast laser including a layer of gain material generally parallel to said composite material layer and disposed within a near field distance thereof, the layer of gain material providing amplification for the radiation propagating through the composite material layer; and means for pumping the layer of gain material to a lasing condition for said ballast laser, said amplification of the radiation propagating through the composite material layer being gain-clamped when said ballast laser is lasing.

18. The apparatus of claim 17, said means for pumping comprising one of optical pump means and electrical pump means.

19. The apparatus of claim 17, wherein said composite material layer comprises an electrically conductive film patterned with a dielectric material, and wherein said electrical pump means provides an electrical pump current that passes through the electrically conductive film toward said layer of gain material.

20. The apparatus of claim 19, said electrically conductive film being a first electrically conductive film, the apparatus further comprising a second electrically conductive film similar to said first dielectric film and disposed substantially adjacent to the ballast laser on an opposite side thereof, wherein said electrical pump current passes between said first and second electrically conductive films through said layer of gain material.

* * * * *